United States Patent
Kim et al.

(10) Patent No.: US 9,240,357 B2
(45) Date of Patent: Jan. 19, 2016

(54) METHOD OF FABRICATING SEMICONDUCTOR DEVICE HAVING PRELIMINARY STACKED STRUCTURE WITH OFFSET OXIDE ETCHED USING GAS CLUSTER ION

(71) Applicants: Tae-Gon Kim, Seoul (KR); Jong-Hoon Kang, Seoul (KR); Jae-Young Ahn, Seongnam-si (KR); Jun-Kyu Yang, Seoul (KR); Han-Mei Choi, Seoul (KR); Ki-Hyun Hwang, Seongnam-si (KR)

(72) Inventors: Tae-Gon Kim, Seoul (KR); Jong-Hoon Kang, Seoul (KR); Jae-Young Ahn, Seongnam-si (KR); Jun-Kyu Yang, Seoul (KR); Han-Mei Choi, Seoul (KR); Ki-Hyun Hwang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 51 days.

(21) Appl. No.: 14/100,651

(22) Filed: Dec. 9, 2013

(65) Prior Publication Data
US 2014/0322832 A1 Oct. 30, 2014

Related U.S. Application Data

(60) Provisional application No. 61/815,883, filed on Apr. 25, 2013.

(30) Foreign Application Priority Data

May 29, 2013 (KR) .................. 10-2013-0061113

(51) Int. Cl.
| | |
|---|---|
| H01L 21/66 | (2006.01) |
| H01L 21/265 | (2006.01) |
| H01L 21/311 | (2006.01) |
| H01L 27/115 | (2006.01) |

(52) U.S. Cl.
CPC .......... *H01L 22/12* (2013.01); *H01L 21/31116* (2013.01); *H01L 22/20* (2013.01); *H01L 27/11582* (2013.01); *H01L 2924/0002* (2013.01)

(58) Field of Classification Search
CPC ................................. H01L 21/26566
See application file for complete search history.

(56) References Cited

U.S. PATENT DOCUMENTS

| | | | |
|---|---|---|---|
| 5,907,780 A | 5/1999 | Gilmer et al. | |
| 6,537,606 B2 | 3/2003 | Allen et al. | |
| 6,624,081 B2 | 9/2003 | Dykstra et al. | |
| 7,022,545 B2 | 4/2006 | Yamada et al. | |
| 7,508,034 B2 | 3/2009 | Takafuji et al. | |
| 7,905,199 B2 | 3/2011 | Hautala et al. | |
| 8,193,054 B2* | 6/2012 | Alsmeier | 438/216 |
| 8,236,667 B2 | 8/2012 | Ito et al. | |
| 8,268,700 B2 | 9/2012 | Akiyama et al. | |
| 8,319,275 B2* | 11/2012 | Shim et al. | 257/324 |
| 2011/0049629 A1 | 3/2011 | Ishikawa et al. | |
| 2011/0186937 A1* | 8/2011 | Scheiper et al. | 257/402 |
| 2011/0312180 A1* | 12/2011 | Wang | 438/692 |

(Continued)

*Primary Examiner* — Michael Jung
(74) *Attorney, Agent, or Firm* — Harness, Dickey & Pierce, P.L.C.

(57) ABSTRACT

According to example embodiments of inventive concepts, a method of fabricating a semiconductor device includes: forming a preliminary stack structure, the preliminary stack structure defining a through hole; forming a protection layer and a dielectric layer in the through hole; forming a channel pattern, a gapfill pattern, and a contact pattern in the through hole; forming an offset oxide on the preliminary stack structure; measuring thickness data of the offset oxide; and scanning the offset oxide using a reactive gas cluster ion beam. The scanning the offset oxide includes setting a scan speed based on the measured thickness data of the offset oxide, and forming a gas cluster.

20 Claims, 15 Drawing Sheets

(56) References Cited

U.S. PATENT DOCUMENTS

2013/0330845 A1* 12/2013 Olsen .................. H01L 21/3065
    438/14

2013/0330924 A1* 12/2013 Olsen ...................... H01L 22/26
    438/667

* cited by examiner

METHOD OF FABRICATING SEMICONDUCTOR DEVICE HAVING PRELIMINARY STACKED STRUCTURE WITH OFFSET OXIDE ETCHED USING GAS CLUSTER ION

CROSS-REFERENCE TO RELATED APPLICATION

This application claims priority under 35 U.S.C. §119 to U.S. application No. 61/815,883 filed on Apr. 25, 2013, and also claims priority under 35 U.S.C. §119 to Korean Patent Application No. 10-2013-0061113 filed on May 29, 2013. The entire disclosure of each of the above-referenced applications is hereby incorporated by reference.

BACKGROUND

1. Field

Example embodiments of inventive concepts relate to a method of fabricating a semiconductor device.

2. Description of Related Art

With the scale-down of integrated circuits, vertical cell type semiconductor devices, in which planer configurations are vertically configured, have been suggested, and uniform ion-implantation is desired.

SUMMARY

Example embodiments of inventive concepts relate to a method of fabricating a semiconductor device.

Example embodiments of inventive concepts also relate to a method for improving dispersion of ions and uniformity of a thickness of a thin film.

Aspects of example embodiments of inventive concepts are not limited by the above description, and other unmentioned aspects will be clearly understood by one of ordinary skill in the art from example embodiments of inventive concepts described herein.

In accordance with example embodiments of inventive concepts, a method of fabricating a semiconductor device includes: forming a preliminary stack structure, the preliminary stack structure defining a through hole; forming a protection layer in the through hole; forming a dielectric layer in the through hole; forming a channel pattern, a gapfill pattern, and a contact pattern in the through hole; forming an offset oxide on the preliminary stack structure; measuring two-dimensional (2D) thickness data of the offset oxide of the semiconductor device; and scanning the offset oxide using a reactive gas cluster ion beam. The scanning of the offset oxide may include setting a scan speed based on the measured 2D thickness data of the offset oxide, and forming a gas cluster.

In example embodiments, the scanning the offset oxide using the reactive gas cluster ion beam may include: scanning a portion of the offset oxide having large thickness data for the measured 2D thickness at a slow speed, and scanning a portion of the offset oxide having small thickness data for the measured 2D thickness at a fast speed.

In example embodiments, the scanning the offset oxide using the reactive gas cluster ion beam may include: forming the gas cluster using a reactive gas, and the reactive gas may include one of nitrogen tetrafluoride ($NF_3$), tetrafluoromethane ($CF_4$), and trifluoromethane ($CHF_3$).

In example embodiments, the scanning using the reactive gas cluster ion beam may include etching the offset oxide with different doses of a reactive gas according to an etching thickness to be etched.

In example embodiments, the scanning the offset oxide using the reactive gas cluster ion beam may include scanning the offset oxide using an arch scan method.

In example embodiments, the using the arch scan method may include: performing the scanning the offset oxide using two driving arms by keeping a distance between a common axis and a center of the offset oxide constant.

In example embodiments, the using the arch scan method may include: scanning the offset oxide using two driving arms by, rotating a first driving arm of the two driving arms a clockwise direction, and rotating a second driving arm of the two driving arms a counterclockwise direction.

In example embodiments, the using the arch scan method may include: performing the scanning of the offset oxide by increasing a distance between a common axis and a center of the offset oxide.

In example embodiments, the scanning of the offset oxide using the reactive gas cluster ion beam may include: fixing a position of the reactive gas cluster ion beam, and scanning the offset oxide while driving the offset oxide.

In example embodiments, the offset oxide may include silicon oxide.

In example embodiments, the scanning the offset oxide using a reactive gas cluster ion beam may include reducing a thickness dispersion of the offset oxide to less than 10 Å.

In example embodiments, an ion implantation through the offset oxide may be performed after the scanning the offset oxide using the gas cluster ion beam.

In example embodiments, the ions used in the ion implantation may include at least one of boron (B), phosphorous (P), and arsenic (As).

In example embodiments, the setting the scan speed may include setting the scanning speed to a range of 0.01 to 1 m/s.

In accordance example embodiments of inventive concepts, a method of fabricating a semiconductor device includes: forming a channel pattern on a substrate, forming an offset oxide on the channel pattern; measuring thicknesses of the offset oxide according to locations of the offset oxide; reducing a variation in the thicknesses of the offset oxide by scanning the offset oxide using a gas cluster ion beam according to the measured thicknesses of the offset oxide; and implanting ions through the offset oxide into the channel pattern.

According to example embodiments of inventive concepts, a method of fabricating a semiconductor device includes: forming a preliminary stacked structure on a substrate, the preliminary stacked structure defining a through hole that extends vertically over the substrate; forming a gate dielectric layer surrounding a channel pattern in the through hole; forming an offset oxide on the preliminary stacked structure; measuring a thickness of the offset oxide; and performing a gas cluster ion beam process on the offset oxide, the gas cluster ion beam process including setting a scanning speed of the gas cluster ion beam process based on the measured thickness of the offset oxide.

In example embodiments, measuring the thickness of the offset oxide may include measuring two-dimensional (2D) thickness data of the offset oxide. The performing the gas cluster ion beam process on the offset oxide may include: scanning a portion of the offset oxide having large thickness data for the measured 2D thickness at a slow speed, and scanning a portion of the offset oxide having small thickness data for measured 2D thickness at a fast speed.

In example embodiments, the performing the gas cluster ion beam process may include: forming a gas cluster using a reactive gas, and the reactive gas may include one of nitrogen tetrafluoride ($NF_3$), tetrafluoromethane ($CF_4$), and trifluoromethane ($CHF_3$).

In example embodiments, the performing the gas cluster ion beam process may include etching the offset oxide with different doses of a reactive gas according to an etching thickness to be etched.

In example embodiments, the performing the gas cluster ion beam process may include: fixing a position of a reactive gas cluster ion beam, and scanning the offset oxide while driving the offset oxide using a plurality of driving arms by keeping a distance between a common axis and a center of the offset oxide constant.

BRIEF DESCRIPTION OF THE DRAWINGS

The foregoing and other features and advantages of example embodiments of inventive concepts will be apparent from the more particular description of non-limiting embodiments of inventive concepts, as illustrated in the accompanying drawings in which like reference characters refer to the same parts throughout the different views. The drawings are not necessarily to scale, emphasis instead being placed upon illustrating the principles of example embodiments inventive concepts. In the drawings.

DETAILED DESCRIPTION OF THE EMBODIMENTS

Figure 1A:
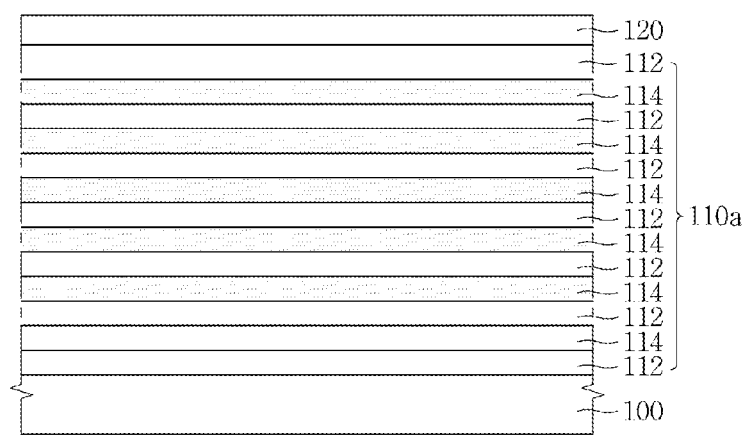
FIGS. 1A to 1U are cross-sectional views illustrating a method of fabricating a semiconductor device according to example embodiments of inventive concepts.

Example embodiments of inventive concepts will now be described more fully with reference to the accompanying drawings in which some example embodiments are shown. Example embodiments of inventive concepts may, however, be embodied in different forms and should not be construed as limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

The terminology used herein is for the purpose of describing particular embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
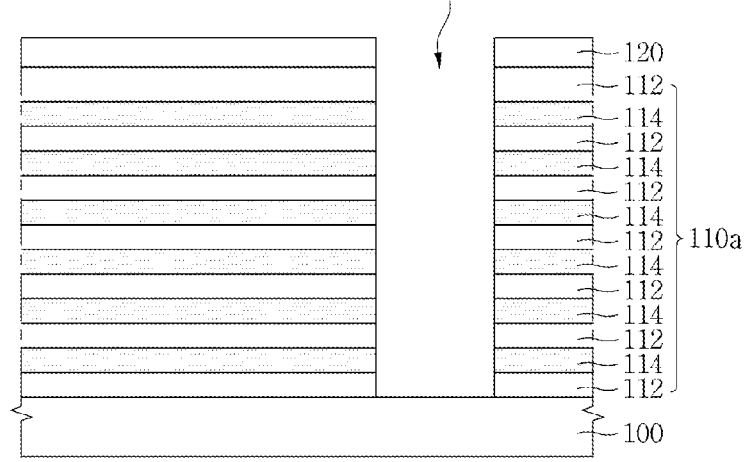
Figure 1C:
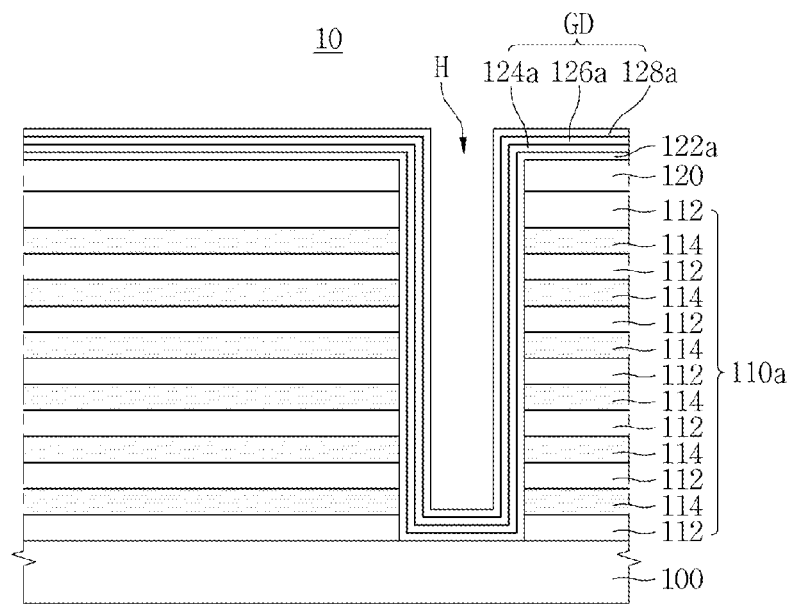
Figure 1D:
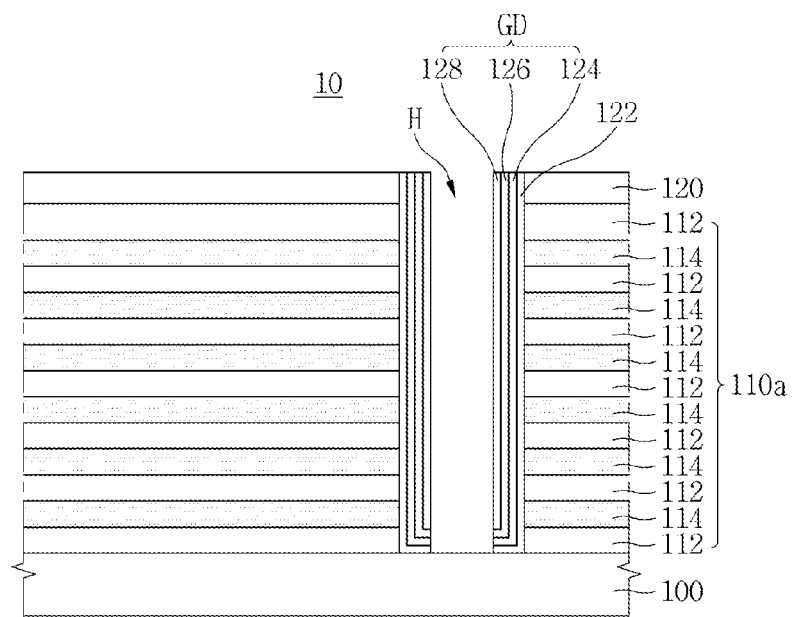
Figure 1E:
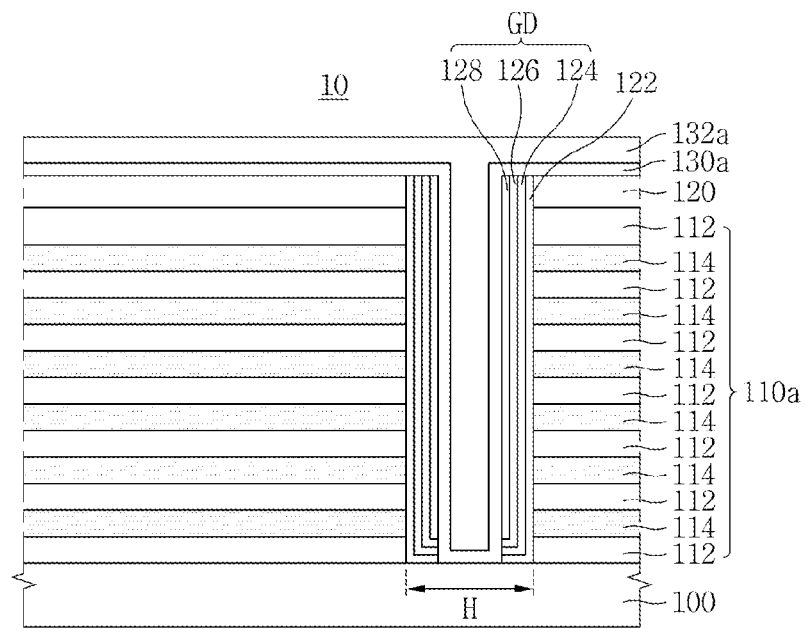
Figure 1F:
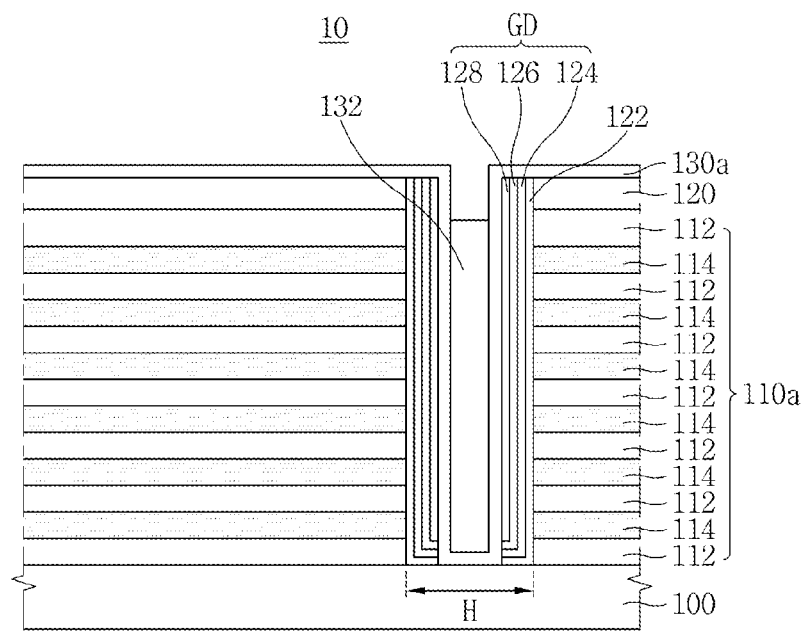
Figure 1G:
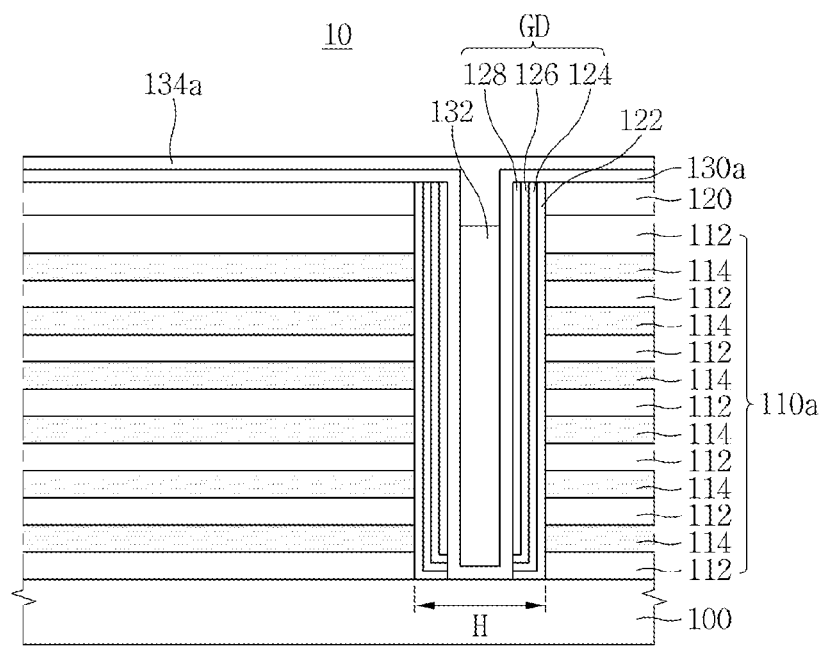
Figure 1H:
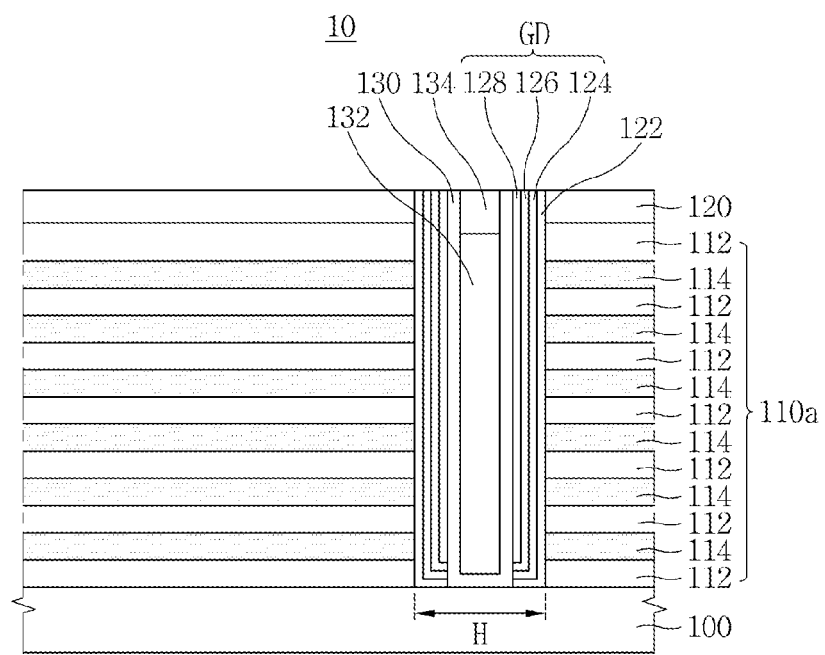
Figure 1I:
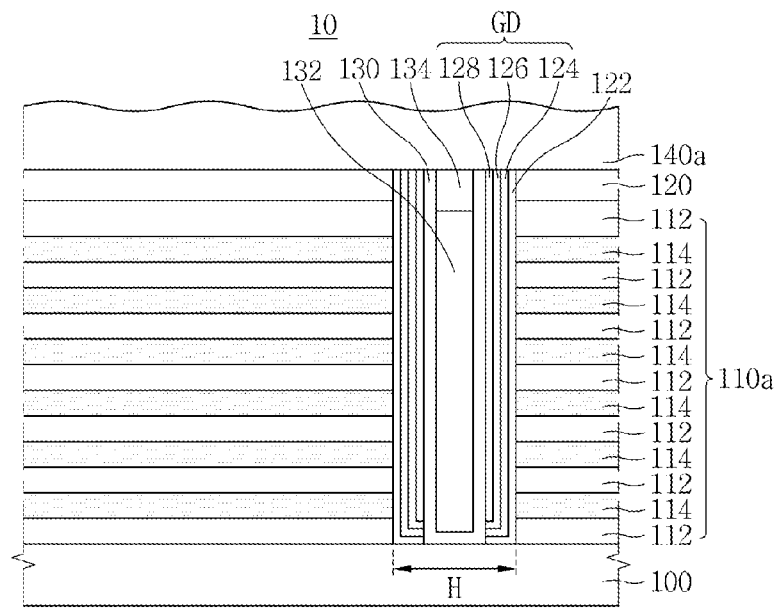
Figure 1J:
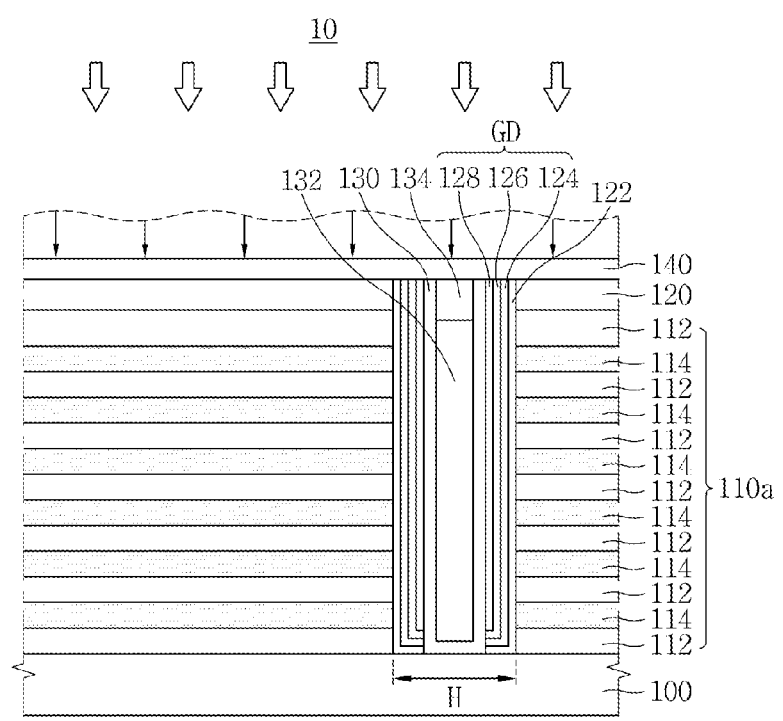
Figure 1K:
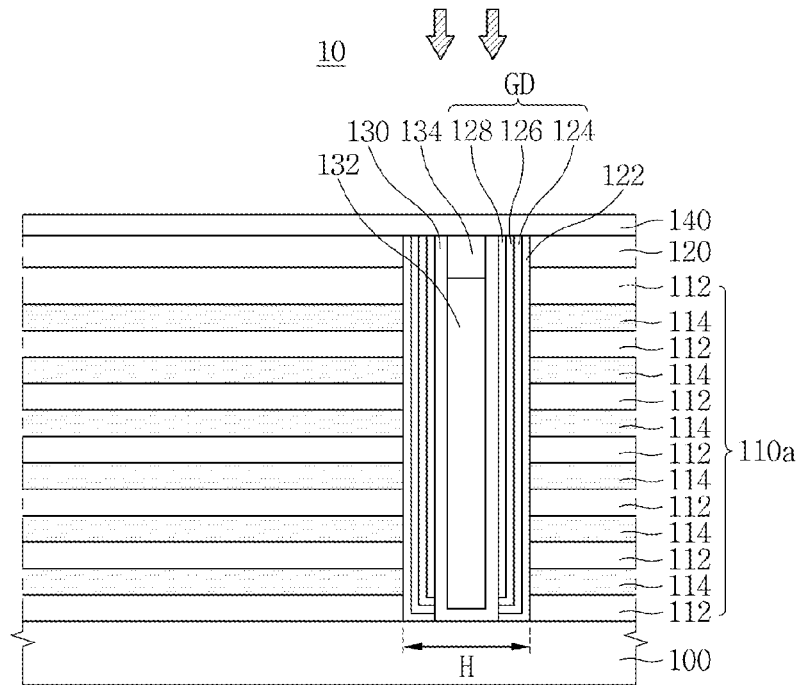
Figure 1L:
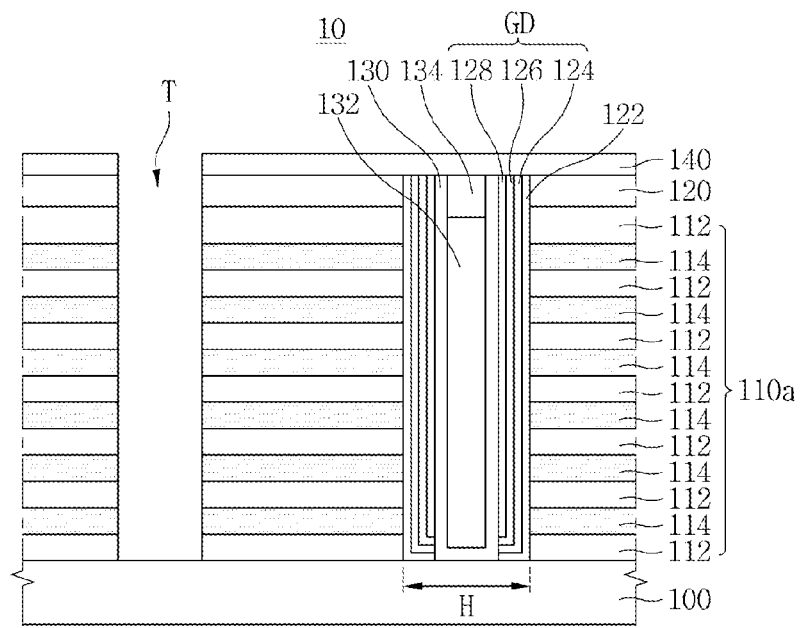
Figure 1M:
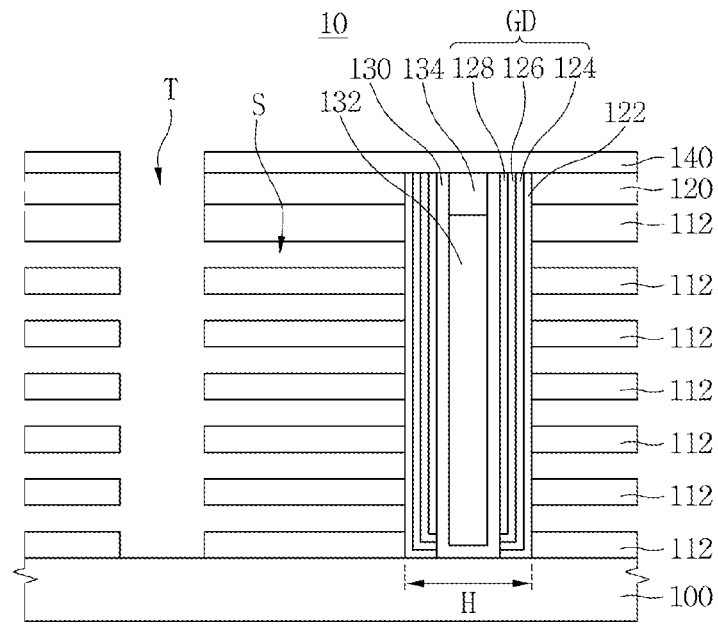
Figure 1N:
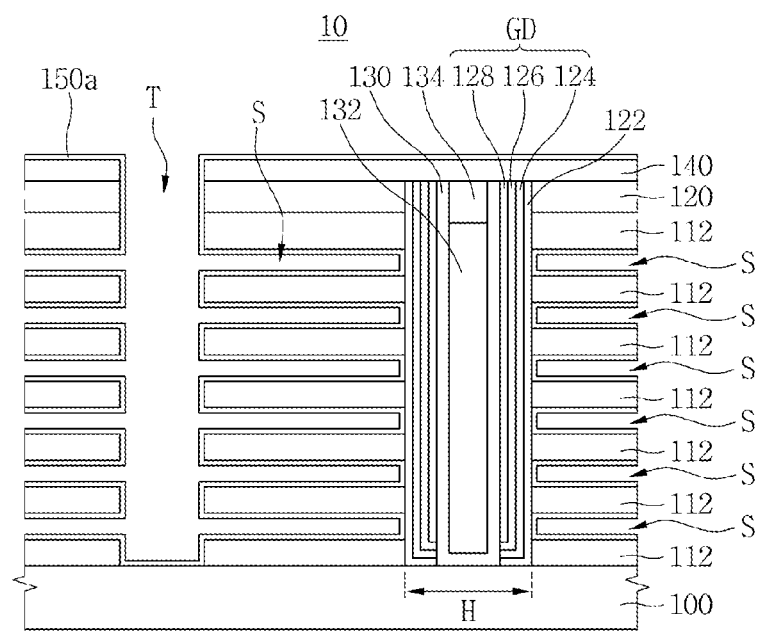
Figure 10:
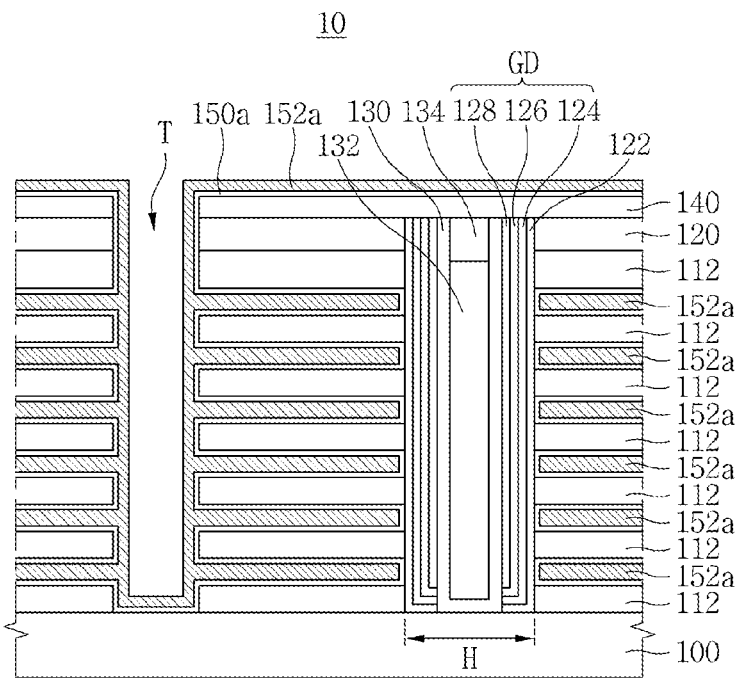
Figure 1P:
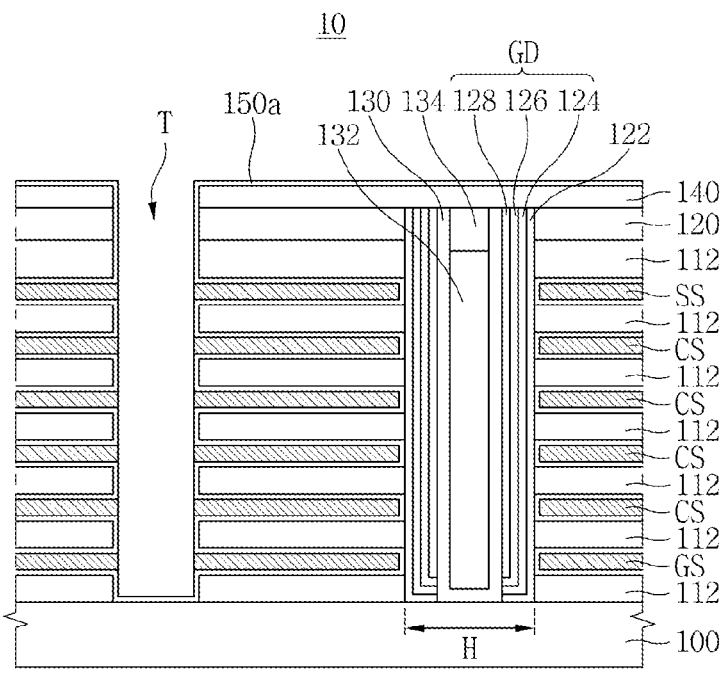
Figure 1Q:
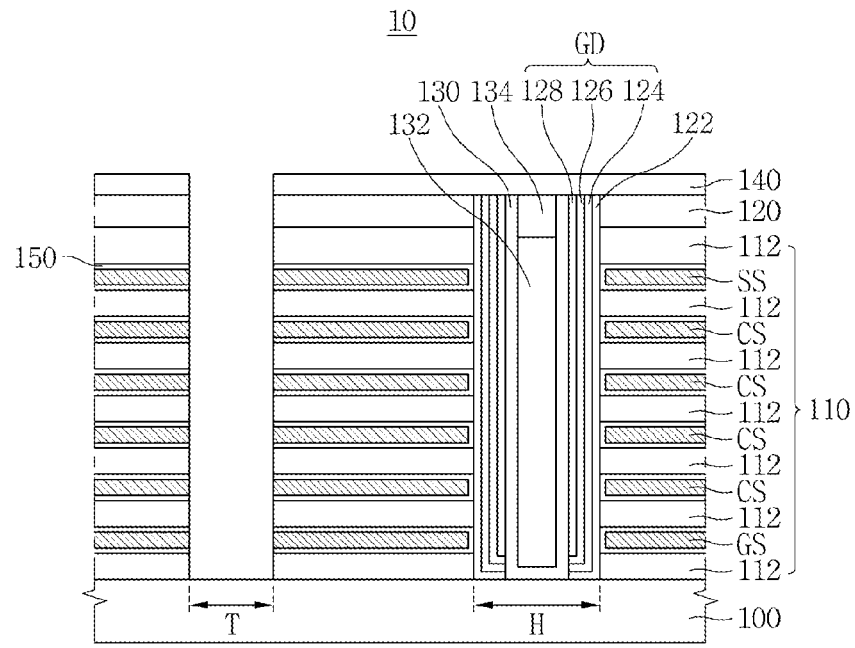
Figure 1R:
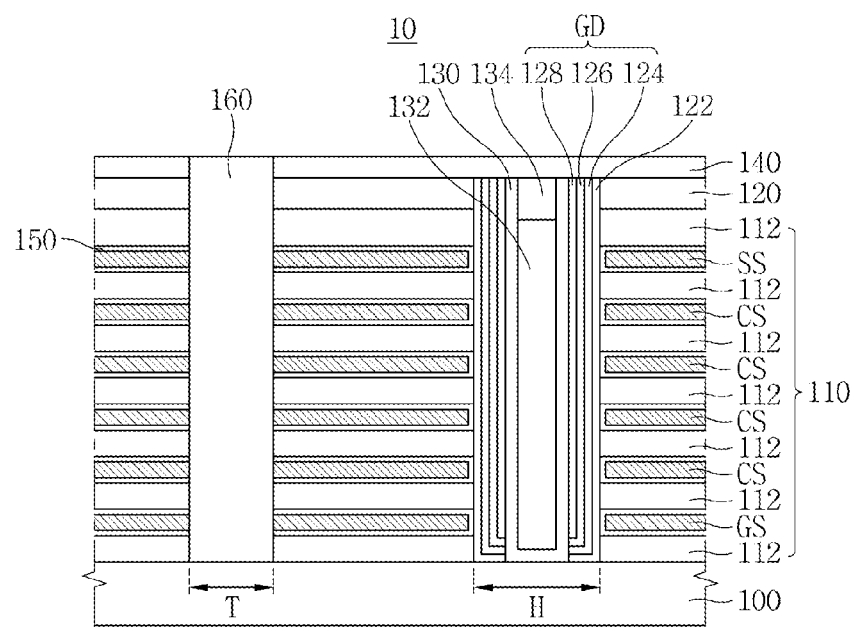
Figure 1S:
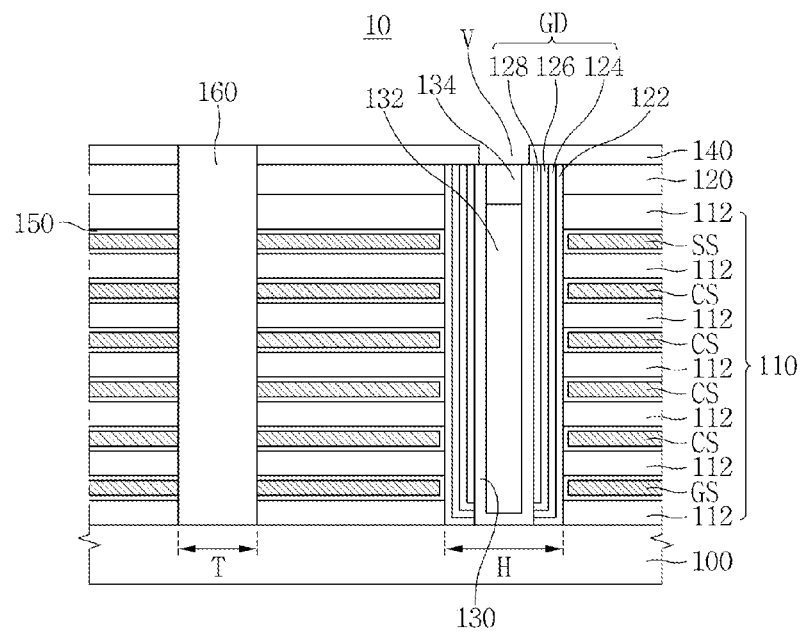
Figure 1T:
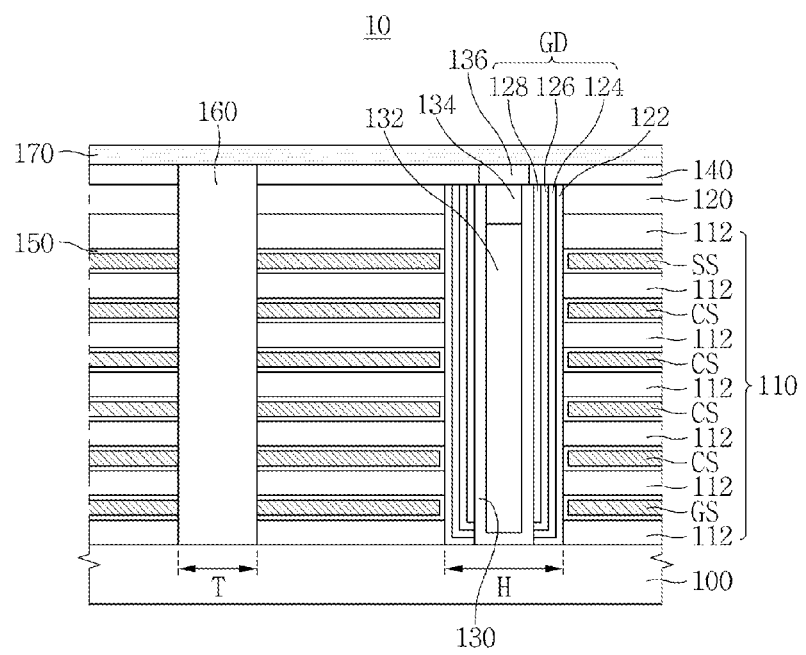
Figure 1U:
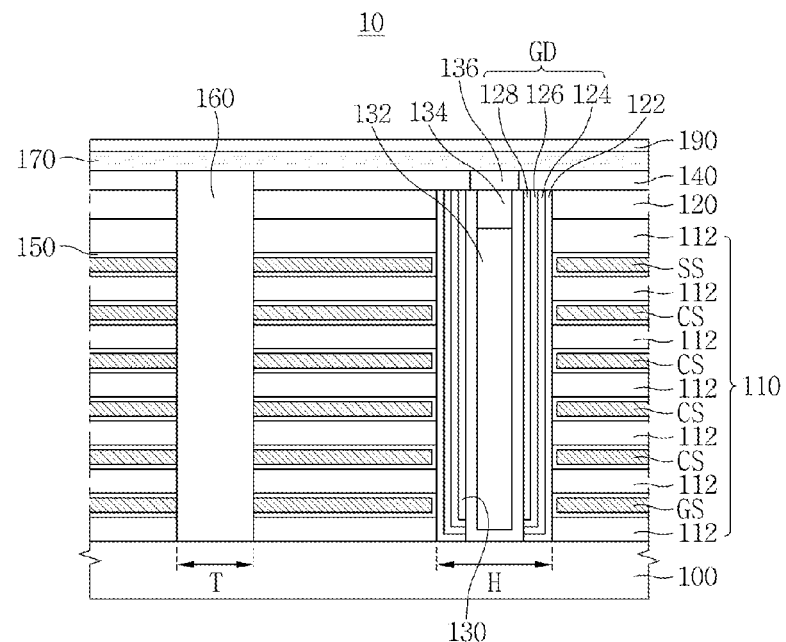

FIGS. 1A to 1U are cross-sectional views illustrating a method of fabricating a semiconductor device in accordance with example embodiments of inventive concepts.

Referring to FIG. 1A, a method of fabricating a semiconductor device 10 in accordance with example embodiments of inventive concepts may include forming a preliminary stack structure 110a by alternately stacking a plurality of interlayer insulating layers 112 and a plurality of sacrificial layers 114 on a substrate 100 with the interlayer insulating layer 112 as a starting material, and forming a first capping layer 120 on the preliminary stack structure 110a. The substrate may be formed of a semiconductor material, and for example, include a silicon (Si) substrate, a germanium (SiGe) substrate, or a silicon on insulator (SOI) substrate. The interlayer insulating layers 112 may include silicon oxide ($SiO_2$). The sacrificial layers 114 may be formed of a material having etch selectivity to the interlayer insulating layers 112. The sacrificial layers 114 may include silicon nitride ($SiN_x$). The first capping layer 120 may include silicon oxide ($SiO_2$).

Referring to FIG. 1B, a through hole H may be formed to vertically penetrate the preliminary stack structure 110a and the first capping layer 120. Forming the through hole H may include forming a desired (and/or alternatively predetermined) mask pattern defining a location of the through hole H, and anisotropically etching the interlayer insulating layers 112 and the sacrificial layers 114 using the mask pattern as an etch mask by turns. In the process of etching the interlayer insulating layers 112 and the sacrificial layers 114, the sides of the interlayer insulating layers 112, the sacrificial layers 114, and the first capping layer 120 may be exposed, and a surface of the substrate 100 may be exposed in a bottom of the through hole H.

Referring to FIG. 1C, a protection layer 122a and dielectric layers GD may be formed on exposed sides on the interlayer insulating layers 112, the sacrificial layers 114, and the first capping layer 120, and an upper surface of the capping layer 120. The protection layer 122a may be formed using a process of forming silicon oxide such as an in situ steam generation (ISSG) process or using a deposition process such as an atomic layer deposition (ALD), but example embodiments of inventive concepts are not limited thereto. The protection layer 122a may include silicon oxide. The dielectric layers GD may include a barrier dielectric layer 124a, a trap dielectric layer 126a, and a tunneling dielectric layer 128a. The barrier dielectric layer 124a, the trap dielectric layer 126a, and the tunneling dielectric layer 128a may be formed using a deposition process such as ALD or chemical vapor deposition (CVD). The barrier dielectric layer 124a may include silicon oxide ($SiO_2$), the trap dielectric layer 126a may include silicon nitride ($SiN_x$), and the tunneling dielectric layer 128a may include silicon oxide ($SiO_2$) or silicon oxide doped with nitrogen.

Referring to FIG. 1D, the protection layer 122a, barrier dielectric layer 124a, trap dielectric layer 126a, and tunneling dielectric layer 128a may be patterned to form a protection pattern 122, a barrier layer 124, a charge trap layer 126, and a tunneling layer 128 in the through hole H. Forming the protection pattern 122, the barrier layer 124, the charge trap layer 126, and the tunneling layer 128 may include performing a blanket anisotropic etching process to partially remove the protection layer 122a and the plurality of dielectric layers GD. Through the blanket anisotropic etching process, the protection layer 122a may be etched to form the protection pattern 122 in contact with a sidewall of the through hole H, the barrier dielectric layer 124a may be etched to form the barrier layer 124 in contact with the protection pattern 122, the trap dielectric layer 126a may be etched to form the charge trap layer 126 in contact with the barrier layer 124, and the tunnel dielectric layer 118a may be etched to form the tunneling layer 128 in contact with the charge trap layer 126. A surface of the substrate 100 may be exposed in the etching process.

Referring to FIG. 1E, a channel layer 130a and a gapfill layer 132a may be formed along a surface of the substrate 100, a surface of the tunneling layer 128, and an upper surface of the first capping layer 120. The channel layer 130a may be formed using an ALD method or a CVD method. The channel layer 130a may be formed to a thickness, for example, a thickness in a range of 1/50 to 1/5 of a width of the through hole H. The channel layer 130a may include polysilicon. The gapfill layer 132a may include an insulating layer such as silicon oxide, but example embodiments of inventive concepts are not limited thereto.

Referring to FIG. 1F, the gapfill layer 132a may be patterned to form a gapfill pattern 132 that fills a portion of the through hole H. The gapfill pattern 132 may be formed by partially removing an upper portion of the gapfill layer 132a using an etch back process. An upper surface of the gapfill pattern 132 may be formed to be lower than that of the first capping layer 120, and the gapfill pattern 132 may be included between sides of the channel layer 130a. The gapfill pattern 132 may be formed in the inside of the through hole H.

Referring to FIG. 1G, a contact layer 134a may be formed on the gapfill pattern 132. The contact layer 134a may be disposed along the upper surface of the gapfill pattern 132, and the sides and an upper surface of the channel layer 130a. The contact layer 134a may include polysilicon.

Referring to FIG. 1H, in accordance with example embodiments of inventive concepts, the contact layer 134a and the channel layer 130a may be patterned into a cylindrical-shaped channel pattern 130 and a contact pad 134. Forming the channel pattern 130 and the contact pad 134 may include a performing a planarization process for exposing the upper surface of the first capping layer 120 by partially removing the channel layer 130a and the contact layer 134a. For example, the planarization process may include a chemical mechanical polishing (CMP) process.

Referring to FIG. 1I, an offset oxide 140a may be formed on the through hole H and the preliminary stack structure 110a.

Referring to FIG. 1J, the offset oxide 140a may be etched using a gas cluster ion beam process. A thickness dispersion of the offset oxide 140 may be controlled to be equal to or less than 10 Å by controlling an etch rate through the gas cluster ion beam process. An etching process using the gas cluster ion beam process according to example embodiments of inventive concepts will be described in further detail below.

Referring to FIG. 1K, in accordance with example embodiments of inventive concepts, ions may be implanted into the channel pattern 130 through the offset oxide 140. Elements for the implantation into the channel pattern 130 using an ion implantation process may include any one of boron (B), phosphorous (P), and arsenic (As). In other words, the ions used in the ion implantation may include at least one of boron (B), phosphorous (P), and arsenic (As). When the thickness dispersion of the offset oxide 140 is reduced to be equal to or less than 10 Å, dispersion of a projection range (Rp) in which ions used in implantation for a threshold voltage (Vt) stop may be drastically improved.

Referring to FIG. 1L, a trench T penetrating the preliminary stack structure 110a may be formed. Forming the trench T may include forming an etch mask in a region in which the trench T is defined, and sequentially anisotropically etching the offset oxide 140 and the first capping layer 120, and etching by turns the preliminary stack structure 110a below the etch mask until the upper surface of the substrate 100 is exposed.

Referring to FIG. 1M, interlayer spaces S may be formed by removing the sacrificial layers 114 disposed between the interlayer insulating layers 112 through the trench T. The etching process of removing the sacrificial layers 114 may include an isotropic etching method such as a wet etch method or a chemical dry etch (CDE) method. The etching process may use an etchant that selectively removes the sacrificial layers 114 compared to the interlayer insulating layers 112. For example, if the sacrificial layers 114 include silicon nitride ($SiN_x$) and the interlayer insulating layers 112 include silicon oxide ($SiO_2$), phosphoric acid ($H_3PO_4$) may be used as an etchant used in the wet etch process to remove the sacrificial layers 114, but example embodiments are not limited thereto. A cleaning process using standard cleaning 1 (SC-1) may be further included in the etching process.

Referring to FIG. 1N, a blocking dielectric layer 150a may be formed on exposed surfaces of the inter layer insulating layers 112, the first capping layer 120, and the offset oxide 140 through the trench T and the interlayer spaces S. The blocking dielectric layer 150a may include a metal oxide having a work function (and/or dielectric constant) higher than those of the barrier layer 124 and the protection pattern 122. For example, the metal oxide may include aluminum oxide ($Al_2O_3$) or hafnium oxide ($HfO_2$).

Referring to FIG. 1O, a conductive layer 152a may be formed to cover a surface of the blocking dielectric layer 150a. The conductive layer 152a may be formed to fill the interlayer spaces S. The conductive layer 152a may include a doped silicon, a metal such as tungsten (W), copper (Cu), or aluminum (Al), conductive metal nitride such as titanium nitride (TiN) or tantalum nitride (TaN), a conductive metal-semiconductor compound such as metal silicide, transition metal such as titanium (Ti) or tantalum (Ta), or the like. For example, the conductive layer 152a may include W or TiN. However, example embodiments of inventive concepts are not limited thereto.

Referring to FIG. 1P, a plurality of gate electrodes GS, CS, and SS may be formed by partially removing the conductive layer 152a. The plurality of gate electrodes GS, CS, and SS may include a ground selection gate electrode GS, a plurality of cell selection gate electrodes CS, and a string selection gate electrode (SS). The ground selection gate electrode GS may be the lowest electrode close to the substrate, and the string selection gate electrode SS may be an electrode closest to the first capping layer 120 below the first capping layer 120. The cell selection gate electrodes CS may be between the string selection gate electrode SS and the ground selection gate electrode GS. The cell gate electrodes CS may be formed as many as $2^n$, where n is a natural number.

Referring to FIG. 1Q, a blocking layer 150 surrounding the gate electrodes GS, CS, and SS may be formed by partially removing the blocking dielectric layer 150a. The blocking layer 150 may surround an upper surface, a lower surface, and one side of each of the gate electrodes GS, CS, and SS. A stack structure 110 may be formed by forming the blocking layer 150, the gate electrodes GS, CS, and SS, and the interlayer insulating layer 112.

Referring to FIG. 1R, a trench insulating material 160 may be formed in the trench T. The trench insulating material 160 may include a dielectric material such as silicon oxide ($SiO_2$).

Referring to FIG. 1S, a via V that exposes the contact pad 134 may be formed by selectively removing the offset oxide 140.

Referring to FIG. 1T, a contact electrode 136 may be formed to fill the via V and contact an upper surface of the contact pad 134, and a bit line 170 that is electrically connected to the contact electrode 136 may be formed to cover an upper surface of the offset oxide 140. The contact electrode 136 and the bit line 170 may include a metal, a metal compound, or metal silicide. However, example embodiments of inventive concepts are not limited thereto.

Referring to FIG. 1U, an insulating layer 190 may be formed on the bit line 170.

Hereinafter, a process of reducing a thickness variation of the offset oxide 140 using a gas cluster ion beam process according to example embodiments of inventive concepts will be described.

The method of fabricating the semiconductor device 10 in accordance with example embodiments of inventive concepts may include measuring a thickness of the offset oxide 140. As a thickness measurement method of the offset oxide 140, a direct observation method may include using a scanning electron microscope (SEM), a mechanical method may include using a stylus, and an optical method may include using an ellipsometry apparatus. In accordance with example embodiments of inventive concepts, to get two-dimensional (2D) data for the thickness of the offset oxide, the thickness of the offset oxide 140 may be measured using the ellipsometry method.

In accordance with example embodiments of inventive concepts, a method of fabricating the semiconductor device 10 may include setting a scanning speed based on the measured thickness data of the offset oxide 140. A thickness of the offset oxide 140 etched in the gas cluster ion beam process may be determined by a dose of a gas cluster implanted into the offset oxide 140. The dose indicates the number of ions implanted per a unit area, and the gas cluster including a dose in a range of $10^{17}$ to $10^{22}$ ions/$cm^2$ may be used in the gas cluster ion beam process. Therefore, the thickness of the offset oxide 140 may be varied at respective locations of the offset oxide 140 by applying different currents to the locations of a surface of the offset oxide 140. By the same principle, an etching depth of the offset oxide 140 may be determined through a method of changing a scanning speed of an ion beam of the gas cluster.

The scanning speed may be set on the basis of the measured 2D thickness data (hereinafter, $d_{xy}$ is defined by thickness data to planar coordinates (x, y) of the offset oxide) of the offset oxide 140. Fast scanning speed may be set to a portion of the offset oxide 140 having a small thickness and slow scanning speed may be set to a portion of the offset oxide having a large thickness. For example, the scanning speed may be in a range of 0.01 to 1 m/s, the fast scanning speed may be a scanning speed that is a greater than the slow scanning speed within the range of 0.01 to 1 m/s, and the large thickness data may correspond to a value that is greater than the small thickness data, but example embodiments of inventive concepts are not limited thereto. An etching process may be performed on the offset oxide 140 included in the semiconductor device 10 using a reactive gas based on the scanning speed-set data. For example, the reactive gases may include nitrogen trifluoride (NF$_3$), tetrafluoromethane (CF$_4$), and/or trifluoromethane (CHF$_3$), but example embodiments of inventive concepts are not limited thereto. The gas cluster ion beam process may be performed at a pressure of $10^{-3}$ to $10^{-8}$ Torr in a chamber 204 supplying a gas cluster since the gas cluster may be formed when a high pressure gas source is expanded and injected in a vacuum state through a supersonic nozzle. When the pressure in the chamber 204 exceeds $10^{-3}$ Torr, a mean free path may be reduced, and thus reaction due to collision between the gas cluster and a surface of the offset oxide 140 may be less. When the pressure in the chamber 204 is less than $10^{-8}$ Torr, production costs may be higher due to installing a diffusion pump.

Figure 2:
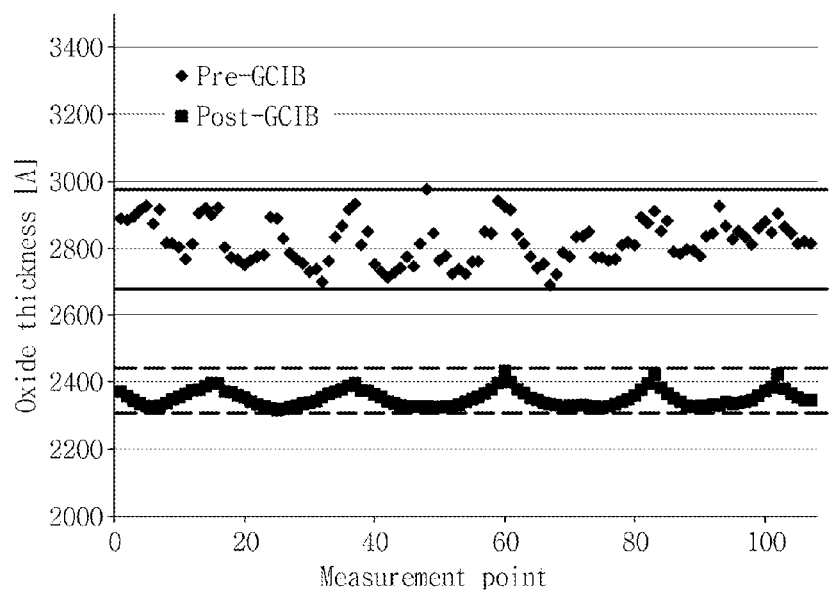
FIG. 2 is a graph showing the thickness variation of pre-GCIB (before the gas cluster ion beam process is performed) and post-GCIB (after the gas cluster ion beam process is performed) in accordance with example embodiments of inventive concepts.

FIG. 2 is a graph showing the thickness variation of pre-GCIB (before the gas cluster ion beam process is performed) and post-GCIB (after the gas cluster ion beam process is performed) according to example embodiments of inventive concepts. For example, the two thickness data are shown on the graph. First, a case in which showing the thickness variation before the gas cluster ion beam process is performed is represented by ♦pre-GLIB. Second, a case in which showing the thickness variation after the gas cluster ion beam process is performed is represented by ■post-GCIB. In FIG. 2 X-axis denotes the number of measurement point and Y-axis denotes the thickness of the offset oxide 140 in Å unit. The reactive gas is nitrogen trifluoride (NF$_3$). The dose of the gas cluster implanted into the offset oxide 140 is controlled according to scanning speed of the ion beam of the gas cluster.

Referring to FIG. 2, the thickness of offset oxide 140 is decreased to 2300 Å. The thickness dispersion is 25 Å. The GOB process effectively makes the thickness dispersion of the offset oxide 140 reduced.

FIGS. 3A to 3D are views illustrating an etching process using an arch scan in the gas cluster ion beam process according to example embodiments of inventive concepts. In an etching process using an arch scan according to example embodiments of inventive concepts, an ion beam 210 extracted from a gas cluster ion beam source may be fixed, and an upper surface of the offset oxide 140 included in the semiconductor device 10 may be disposed to a direction perpendicular to a moving direction of the ion beam 210. The upper surface of the offset oxide 140 included in the semiconductor device 10 may be displaced according to a movement of the driving arms 222 and 224. In FIGS. 3A to 3D, a first location of a scanning arm assembly 200 including the offset oxide 140 is indicated as a dotted line, and a final location of the scanning arm assembly 200 is indicated as a solid line.

Figure 3A:
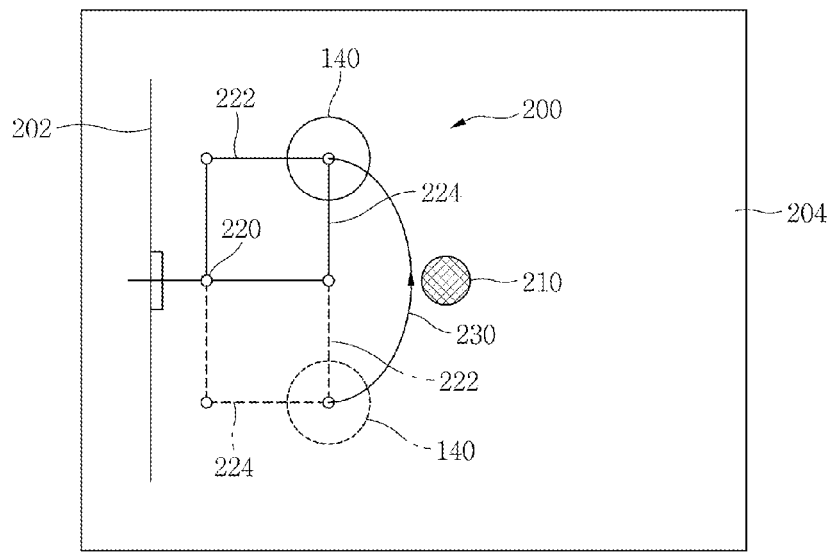
FIGS. 3A to 3D are views illustrating an etching process using arch scan in a gas cluster ion beam (GCIB) process in accordance with example embodiments inventive concepts.

Referring to FIG. 3A, in an etching process using an arch scan in the gas cluster ion beam process according to example embodiments of inventive concepts, a scan pattern 230 may be formed (and/or obtained) by simultaneously moving the driving arms 222 and 224. The scanning arm assembly 200 may be mounted on a wall 202 of the chamber 204, and may be operated by a programmed computer. In the scanning arm assembly 200, the scan pattern 230 may be driven from a starting location toward the bottom left together with the offset oxide 140 which may be scanned by the gas cluster ion beam 210, and the driving arms 222 and 224 may be driven at speed set by software to a counterclockwise direction. The moving direction may be indicated by an arrow. A radius between the center of the offset oxide 140 and a common axis 220 may be kept constant with respect to the total scan pattern 230. Therefore, the scan pattern 230 may form an arch centered on the common axis 220.

Figure 3B:
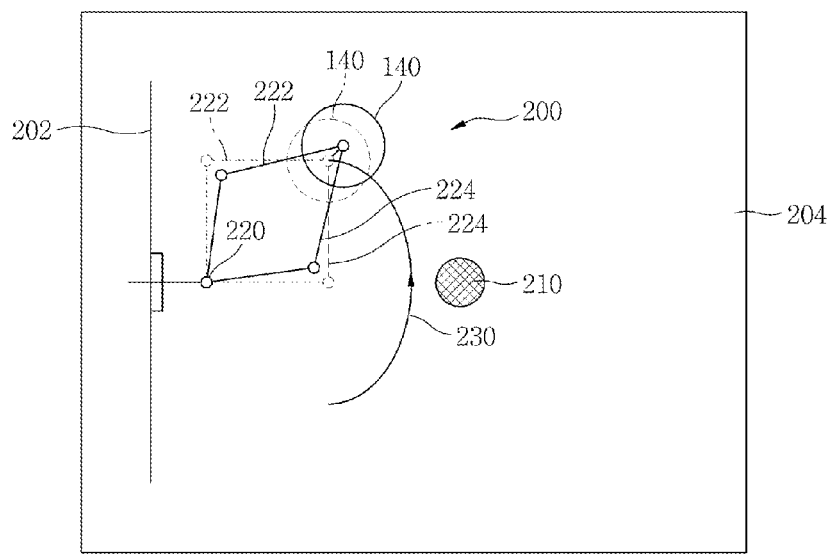

Referring to FIG. 3B, according to example embodiments of inventive concepts, a method may include moving the driving arms 222 and 224 in a reverse direction after the arch scanning. The reverse moving of the driving arms 222 and 224 may include moving the driving arm 222 to a clockwise direction, and moving the driving arm 224 to a counterclockwise direction. A radius between the common axis 220 and the center of the offset oxide 140 is increased by the reverse driving of the driving arms 222 and 224.

Figure 3C:
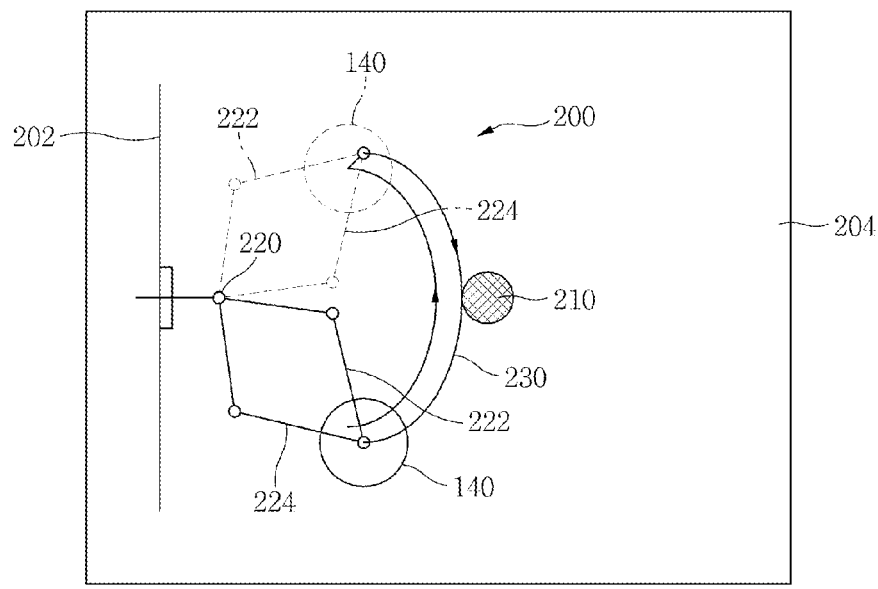

Referring to FIG. 3C, according to example embodiments of inventive concepts, the etching process using an arch scan in the gas cluster ion beam process may include forming a scan pattern 230 which may be obtained by simultaneously moving the driving arms 222 and 224, which have been moved in reverse direction. The scan pattern 230 may be formed from a starting location toward upper left together with the offset oxide 140 which may be scanned by the gas cluster ion beam 210, and all the driving arms 222 and 224 may be moved at speed set by the software to a clockwise direction. A radius between the common axis 220 and the center of the offset oxide 140 may be kept constant with respect to the total scan pattern 230. The scan pattern 230 may further include an additional arch centered on the common axis 220, and the arch having a larger radius may be formed.

Figure 3D:
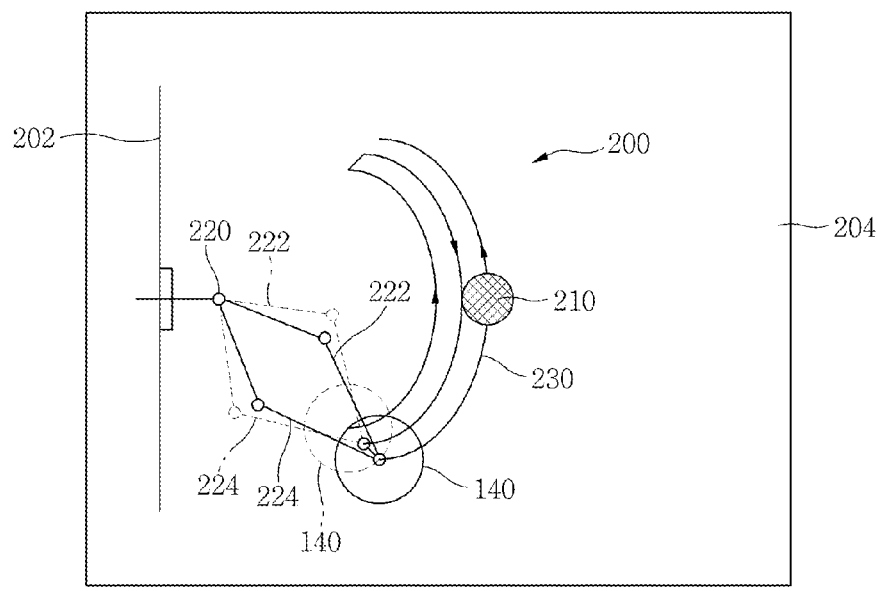

Referring to FIG. 3D, according to example embodiments of inventive concepts, the etching process using an arch scan in the gas cluster ion beam process may include moving the driving arms 222 and 224 in a reverse direction, and increasing a radius between the common axis 220 and the center of the offset oxide 140 again. The reverse moving of the driving arms 222 and 224 may include moving the driving arm 222 to a clockwise direction, and moving the driving arm 224 to a counterclockwise direction. The radius between the common axis 220 and the center of the offset oxide 140 may be increased by the reverse moving of the driving arms 222 and 224. The process of scanning by moving of the driving arms 222 and 224 to the same direction, and the process of increasing a radius between the common axis 220 and the center of the offset oxide 140 by the reverse moving of the driving arms 222 and 224 may be repeated. The scan patterns 230 may correspond to arches of a circle centralized on the common shaft 220, and having radii which are increased and then reduced.

Figure 4A:
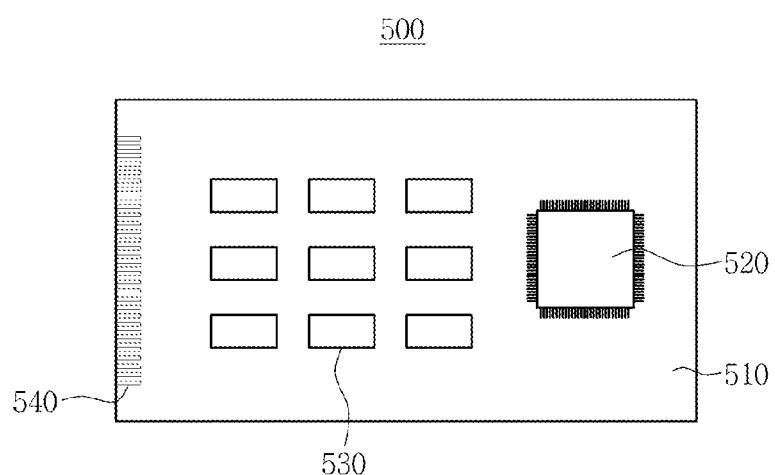
FIG. 4A is a conceptual diagram illustrating a module including at least one semiconductor packages in accordance with example embodiments of inventive concepts.

FIG. 4A is a conceptual diagram illustrating a semiconductor module 500 including semiconductor devices 10 in accordance with example embodiments of inventive concepts. Referring to FIG. 4A, a semiconductor module 500 in accordance with example embodiments of inventive concepts may include a semiconductor device 530 in accordance with example embodiments of inventive concepts mounted on a semiconductor module substrate 510. The semiconductor module 500 may further include a microprocessor 520 mounted on the module substrate 510. Input/output terminals 540 may be arranged in at least one edge of the module substrate 510. The semiconductor module 500 may include a memory card or a solid state drive (SSD).

Figure 4B:
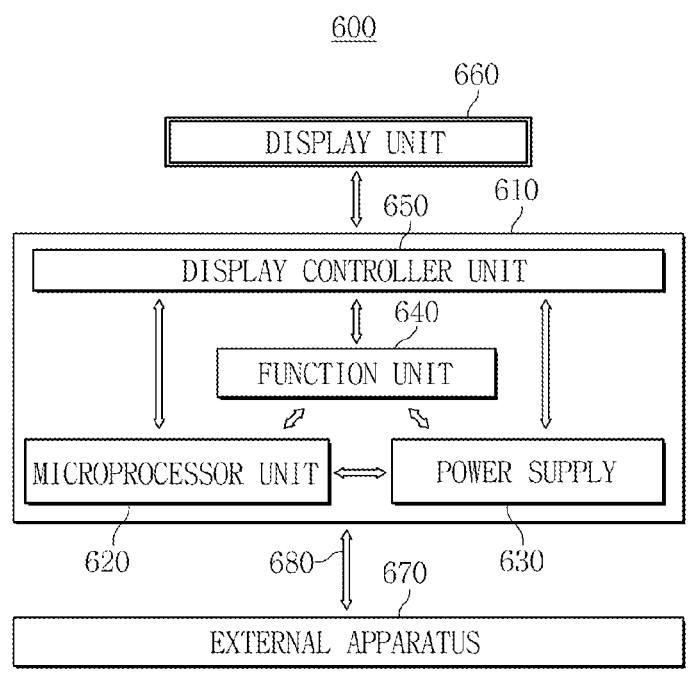
FIG. 4B is a conceptual diagram illustrating an electronic system including at least one semiconductor package in accordance with example embodiments of inventive concepts.

FIG. 4B is a conceptual block diagram illustrating an electronic system including a semiconductor device 10 in accordance with example embodiments of inventive concepts. Referring to FIG. 3B, a semiconductor device 10 in accordance with example embodiments of inventive concepts may be applied to an electronic system 600. The electronic system 600 may include a body 610, a microprocessor unit 620, a power supply 630, a function unit 640, and/or a display controller unit 650. The body 610 may be a system board or a motherboard including a printed circuit board (PCB), or the like. The microprocessor unit 620, the power supply unit 630, the function unit 640, and the display controller unit 650 may be mounted or installed on the body 610. The display unit 660 may be arranged on the upper surface or in the outside of the body 610. For example, the display unit 660 may be disposed on a surface of the body 610 to display an image processed by the display controller unit 650. The power supply unit 630 may receive a constant voltage (or substantial constant) from an external power (not shown), etc., divide the voltage into various levels, and supply those voltages to the microprocessor unit 620, the function unit 640, the display controller unit 650, etc. The microprocessor unit 620 may receive a voltage from the power supply 630 to control the function unit 640 and the display unit 660. The function unit 640 may perform various functions of the electronic system 600. For example, when the electronic system 600 is a mobile electronic apparatus such as a mobile phone, the function unit 640 may have several components which perform functions of the mobile phone such as output of an image to the display unit 660 or output of a voice to a speaker, by dialing or communication with an external apparatus 670. If a camera is installed, the function unit 640 may function as an image processor. In example embodiments of inventive concepts, when the electronic system 600 is connected to a memory card, etc. in order to expand capacity, the function unit 640 may be a memory card controller. The function unit 640 may exchange signals with the external apparatus 670 through a wired or wireless communication unit 680. In addition, when the electronic system 600 needs a universal serial bus (USB), etc. in order to expand functionality, the function unit 640 may function as an interface controller. A semiconductor device 10 according to example embodiments of inventive concepts may be included in the function unit.

Figure 4C:
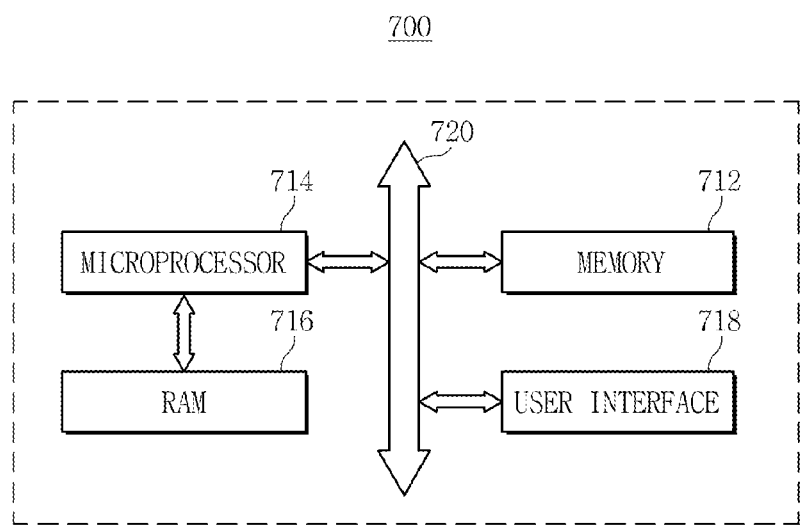
FIG. 4C is a conceptual diagram illustrating an electronic system including at least one semiconductor package in accordance with example embodiments of inventive concepts.

FIG. 4C is a conceptual block diagram illustrating an electronic system 700 in accordance with example embodiments of inventive concepts. Referring to FIG. 4C, an electronic system 700 may include a semiconductor device 10 in accordance example embodiments of inventive concepts. The electronic system may be applied to a mobile electronic apparatus or a computer. For example, the electronic system 700 may include a memory system 712, a microprocessor 714, a random access memory (RAM) 716, and a user interface 718 which performs data communication through a bus 720. The microprocessor 714 may program and control the electronic system 700. The RAM 716 may be used as an operation memory of the microprocessor 714. The microprocessor 714 or the RAM 716 may include a semiconductor device 10 in accordance with example embodiments of inventive concepts. The microprocessor 714, the RAM 716, and/or other components may be assembled within a single package. The user interface 718 may be used to input/output information to/from the electronic system 700. The memory system 712 may store codes for an operation of the microprocessor 714, data processed by the microprocessor 714, or external input data. The memory system 712 may include a controller and a memory.

Figure 4D:
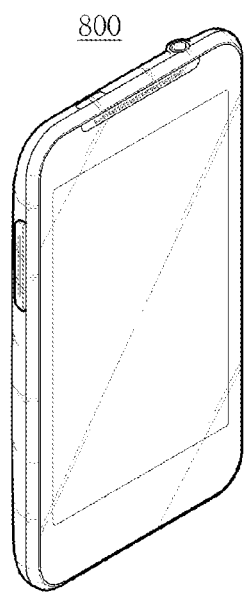
FIG. 4D is a conceptual diagram illustrating a mobile wireless phone including at least one semiconductor package in accordance with example embodiments of inventive concepts.

FIG. 4D is a schematic diagram illustrating a mobile wireless apparatus in accordance with example embodiments of inventive concepts. A mobile wireless apparatus 800 may be interpreted as a tablet personal computer (PC). In addition, a semiconductor device 10 in accordance with example embodiments of inventive concepts may be used in a portable computer such as a laptop computer, an MPEG-1 Audio Layer 3 (MP3) player, an MP4 player, a navigation apparatus, a SSD, a desktop computer, an automobile, or a home appliance, as well as the tablet PC.

A method of fabricating a semiconductor device in accordance with example embodiments of inventive concepts may reduce thickness dispersion of a thin film using a gas cluster ion beam process in a process of fabricating the semiconductor device.

A method of fabricating a semiconductor device in accordance with example embodiments of inventive concepts may obtain uniform ion implantation dispersion (and/or more uniform ion implantation dispersion) by adjusting a thickness of an offset oxide uniformly, and adjusting a dispersion of a threshold voltage (Vt) of a string selection transistor.

A method of reducing thickness variation of a thin film for a semiconductor device in accordance with example embodiments of inventive concepts may optimize an operation of the semiconductor device by reducing (and/or minimizing_ the thickness variation of the thin film required to express device characteristics.

The foregoing is illustrative of example embodiments of inventive concepts and is not to be construed as limiting thereof. While some example embodiments of inventive concepts have been particularly shown and described, it will be understood by one of ordinary skill in the art that variations in form and detail may be made therein without departing from the spirit and scope of the claims. In the claims, means-plus-function clauses are intended to cover the structures described herein as performing the recited function, and not only structural equivalents but also equivalent structures.

What is claimed is:

1. A method of fabricating a semiconductor device, the method comprising:
    forming a preliminary stack structure, the preliminary stack structure defining a through hole;
    forming a protection layer in the through hole;
    forming a dielectric layer in the through hole;
    forming a channel pattern, a gapfill pattern, and a contact pattern in the through hole;
    forming an offset oxide on the preliminary stack structure; and obtaining two-dimensional (2D) thickness data of the offset oxide; and
    scanning the offset oxide using a reactive gas cluster ion beam, the scanning the offset oxide including forming a gas cluster and setting a scan speed based on the 2D thickness data of the offset oxide.

2. The method of claim 1, wherein the scanning the offset oxide using the reactive gas cluster ion beam includes:
    scanning a portion of the offset oxide having large thickness data for the 2D thickness data at a first speed, and
    scanning a portion of the offset oxide having small thickness data for the 2D thickness data at a second speed, the second speed being faster than the first speed.

3. The method of claim 1, wherein the scanning the offset oxide using the reactive gas cluster ion beam includes:
    forming the gas cluster using a reactive gas, and
    the reactive gas includes one of nitrogen trifluoride ($NF_3$), tetrafluoromethane ($CF_4$), and trifluoromethane ($CHF_3$).

4. The method of claim 1, wherein the scanning using the reactive gas cluster ion beam includes:
    etching the offset oxide with different doses of a reactive gas according to an etching thickness to be etched.

5. The method of claim 4, wherein
    the scanning the offset oxide using the reactive gas cluster ion beam includes scanning the offset oxide using an arch scan method,
    the arch scan method includes moving an upper surface of the offset oxide in arch patterns relative an ion beam that is fixed in position.

6. The method of claim 4,
wherein the scanning the offset oxide using the reactive gas cluster ion beam includes scanning the offset oxide using an arch scan method, and
wherein the using the arch scan method includes performing the scanning the offset oxide using two driving arms by keeping a distance between a common axis and a center of the offset oxide constant.

7. The method of claim 4,
wherein the scanning the offset oxide using the reactive gas cluster ion beam includes scanning the offset oxide using an arch scan method, and
wherein the using the arch scan method includes scanning the offset oxide using two driving arms by,
rotating a first driving arm of the two driving arms a clockwise direction, and
rotating a second driving arm of the two driving arms a counterclockwise direction.

8. The method of claim 4,
wherein the scanning the offset oxide using the reactive gas cluster ion beam includes scanning the offset oxide using an arch scan method, and
wherein the using the arch scan method includes
performing the scanning of the offset oxide by increasing a distance between a common axis and a center of the offset oxide.

9. The method of claim 1, wherein the scanning of the offset oxide using the reactive gas cluster ion beam includes:
fixing a position of the reactive gas cluster ion beam, and
scanning the offset oxide while driving the offset oxide.

10. The method of claim 1, wherein the offset oxide includes silicon oxide.

11. The method of claim 1, the scanning the offset oxide using a reactive gas cluster ion beam includes reducing a thickness dispersion of the offset oxide to less than 10 Å.

12. The method of claim 1, further comprising:
performing ion implantation through the offset oxide after the scanning the offset oxide using the gas cluster ion beam.

13. The method of claim 12, wherein ions used in the ion implantation include at least one of boron (B), phosphorous (P), and arsenic (As).

14. The method of claim 1, wherein the setting the scan speed includes setting the scan speed to a range of 0.01 to 1 m/s.

15. A method of fabricating a semiconductor device, the method comprising:
forming a channel pattern on a substrate;
forming an offset oxide on the channel pattern;
measuring thicknesses of the offset oxide according to locations of the offset oxide;
reducing a variation in the thicknesses of the offset oxide by scanning the offset oxide using a gas cluster ion beam according to the measured thicknesses of the offset oxide; and
implanting ions through the offset oxide into the channel pattern, wherein
the reducing the variation in the thicknesses of the offset oxide by scanning the offset oxide using the gas cluster ion beam according to the measured thicknesses of the offset oxide includes setting a scanning speed of the gas cluster ion beam process based on the measured thickness of the offset oxide.

16. A method of fabricating a semiconductor device, the method comprising:
forming a preliminary stacked structure on a substrate, the preliminary stacked structure defining a through hole that extends vertically over the substrate;
forming a gate dielectric layer surrounding a channel pattern in the through hole;
forming an offset oxide on the preliminary stacked structure;
measuring a thickness of the offset oxide; and
performing a gas cluster ion beam process on the offset oxide, the gas cluster ion beam process including setting a scanning speed of the gas cluster ion beam process based on the measured thickness of the offset oxide.

17. The method of claim 16, wherein
the measuring the thickness of the offset oxide includes measuring two-dimensional (2D) thickness data of the offset oxide, and
the performing the gas cluster ion beam process on the offset oxide includes,
scanning a portion of the offset oxide having large thickness data for the measured 2D thickness at a first speed, and
scanning a portion of the offset oxide having small thickness data for the measured 2D thickness at a second speed, the second speed being faster than the first speed.

18. The method of claim 16, wherein the performing the gas cluster ion beam process includes:
forming a gas cluster using a reactive gas; and
the reactive gas includes one of nitrogen trifluoride ($NF_3$), tetrafluoromethane ($CF_4$), and trifluoromethane ($CHF_3$).

19. The method of claim 16, wherein the performing the gas cluster ion beam process includes:
etching the offset oxide with different doses of a reactive gas according to an etching thickness to be etched.

20. The method of claim 16, wherein the performing the gas cluster ion beam process includes:
fixing a position of a reactive gas cluster ion beam, and
scanning the offset oxide while driving the offset oxide using a plurality of driving arms by keeping a distance between a common axis and a center of the offset oxide constant.

* * * * *